(12) United States Patent
Fujita

(10) Patent No.: US 6,559,031 B2
(45) Date of Patent: May 6, 2003

(54) METHOD OF FABRICATING SEMICONDUCTOR DEVICE HAVING ELEMENT ISOLATION TRENCH

(75) Inventor: Kazunori Fujita, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/960,494

(22) Filed: Sep. 24, 2001

(65) Prior Publication Data

US 2002/0037616 A1 Mar. 28, 2002

(30) Foreign Application Priority Data

Sep. 25, 2000 (JP) .................................. 2000-290163

(51) Int. Cl.⁷ .............................................. H01L 21/76
(52) U.S. Cl. ........................ 438/435; 438/424; 438/425
(58) Field of Search ................................ 438/424, 425, 438/435, 437

(56) References Cited

U.S. PATENT DOCUMENTS

| | | | | |
|---|---|---|---|---|
| 6,090,684 A | * | 7/2000 | Ishitsuka et al. | 148/DIG. 50 |
| 6,110,793 A | * | 8/2000 | Lee et al. | 438/400 |
| 6,150,234 A | * | 11/2000 | Olsen | 438/296 |
| 6,242,323 B1 | * | 6/2001 | Ishitsuka et al. | 438/424 |
| 6,323,107 B1 | * | 11/2001 | Ueda et al. | 257/508 |
| 6,326,255 B1 | * | 12/2001 | Ishitsuka et al. | 257/374 |

OTHER PUBLICATIONS

M. Offenberg, M. Liehr, G.W. Rubloff, and K. Holloway, "Ultraclean, Intergrated Processing of Thermal Oxide Structures," Appl. Phys. Lett. 57(12), Sep. 17, 1990, pp. 1254–1256.

K. Makihara, A. Teramoto, K. Nakamura, M. Morita, and T. Ohmi, "Preoxide–Controlled Oxidation for Very Thin Gate Oxide," Extended Abstracts of the 1992 International Conference on Solid State Devices and Materials, Tsukuba, 1992, pp. 120–122.

* cited by examiner

*Primary Examiner*—Trung Dang
(74) *Attorney, Agent, or Firm*—McDermott, Will & Emery

(57) ABSTRACT

A method of fabricating a semiconductor device capable of sufficiently rounding an opening upper end of an element isolation trench is obtained. This method of fabricating a semiconductor device comprises steps of forming an element isolation trench on a semiconductor substrate, performing thermal oxidation on at least an opening upper end of the element isolation trench while increasing the atmosphere temperature of the semiconductor substrate beyond a prescribed temperature thereby forming a first oxide film and suppressing formation of the first oxide film on the opening upper end before the atmosphere temperature is increased beyond the prescribed temperature. Thus, the semiconductor substrate is prevented from oxidation under a low temperature, whereby oxidation is more thickly performed by thermal oxidation in a high-temperature region while relaxing stress applied to the semiconductor substrate. Therefore, oxidation is thickly performed in the high-temperature region not reducing the oxidizing velocity for a corner portion, whereby the opening upper end of the element isolation trench can be sufficiently rounded.

16 Claims, 4 Drawing Sheets

METHOD OF FABRICATING SEMICONDUCTOR DEVICE HAVING ELEMENT ISOLATION TRENCH

BACKGROUND OF THE INVENTION

1. Field of the Invention

The present invention relates to a method of fabricating a semiconductor device, and more specifically, it relates to a method of fabricating a semiconductor device having an element isolation trench.

2. Description of the Prior Art

As the degree of integration of a semiconductor device is improved, a technique of finely working the semiconductor device becomes more and more important. An element isolation technique for isolating semiconductor elements forming the semiconductor device from each other is known as such a fine working technique. In relation to this element isolation technique, a method referred to as trench isolation is frequently employed as the degree of integration is improved.

In this trench isolation, an element isolation trench is formed on a semiconductor substrate and an insulating material or the like is embedded in the formed trench, thereby isolating element regions located on both sides of the trench from each other.

The aforementioned trench is formed by etching the semiconductor substrate. A corner portion is defined on an opening upper end of the trench formed by etching. An electric field or stress is concentrated at this corner portion, to disadvantageously deteriorate the characteristics of the semiconductor device. In general, therefore, a method of forming the trench and thereafter rounding the corner portion on the opening upper end of the formed trench by thermal oxidation thereby preventing the corner portion from concentration of an electric field or stress is proposed.

The aforementioned thermal oxidation for rounding the corner portion located on the opening upper end of the trench must be performed at a high temperature. However, when the temperature in an apparatus for thermal oxidation is previously increased to a level for performing thermal oxidation and the semiconductor substrate is thereafter inserted into this apparatus, for example, the semiconductor substrate may disadvantageously cause warpage or slip dislocation.

In order to suppress such warpage or slip dislocation of the semiconductor substrate, therefore, a method of inserting the semiconductor substrate into the apparatus for thermal oxidation, which is kept at a relatively low temperature, and thereafter increasing the temperature in the apparatus is proposed.

In this proposed method, however, the semiconductor substrate is disadvantageously oxidized before the temperature reaches a level sufficient for rounding the corner portion on the opening upper end of the semiconductor substrate. An oxide film formed under such a low temperature hardly flows in low-temperature oxidation due to a high coefficient of viscosity. When oxidation is performed under a low temperature, therefore, stress is readily applied to the semiconductor substrate due to volume expansion following oxidation. Particularly on the corner portion of the opening upper end, the semiconductor substrate is oxidized from two directions, i.e., upper and side directions, and hence stress applied to the opening upper end is larger than that applied to the remaining portions. The stress applied to the opening upper end is increased in proportion to the thickness of the oxide film formed at a low temperature. When the stress applied to the opening upper end is increased, the oxidation rate (oxidizing velocity) is so disadvantageously reduced that an overhanging point is formed on the corner portion of the opening upper end. In other words, the corner portion of the opening upper end is pointed in the form of an overhang when the thickness of the oxide film formed at a low temperature is in a large ratio to the thickness of the desired thermal oxide film. Even if oxidation is performed in a high-temperature region sufficient for relaxing stress by viscous flow, therefore, the quantity of oxidation is relatively reduced and hence the corner portion of the opening upper end cannot be sufficiently rounded.

SUMMARY OF THE INVENTION

An object of the present invention is to provide a method of fabricating a semiconductor device capable of sufficiently rounding an opening upper end of an element isolation trench.

Another object of the present invention is to perform high-temperature oxidation while relaxing stress applied to a semiconductor substrate in the aforementioned method of fabricating a semiconductor device.

Still another object of the present invention is to suppress thermal nitriding that may be caused when the temperature of a semiconductor substrate is increased to a prescribed level or etching with an extremely small amount of oxygen in the aforementioned method of fabricating a semiconductor device.

A further object of the present invention is to suppress formation of a thermal oxide film when the temperature is reduced after formation of an oxide film in the aforementioned method of fabricating a semiconductor device.

A method of fabricating a semiconductor device according to an aspect of the present invention comprises steps of forming an element isolation trench on a semiconductor substrate, performing thermal oxidation on at least an opening upper end of the element isolation trench while increasing the atmosphere temperature of the semiconductor substrate beyond a prescribed temperature thereby forming a first oxide film and suppressing formation of the first oxide film on the opening upper end before the atmosphere temperature is increased beyond the prescribed temperature.

In the method of fabricating a semiconductor device according to this aspect, formation of a first oxide film having a large thickness in a low-temperature region can be prevented by suppressing formation of the first oxide film on the opening upper end before the atmosphere temperature is increased beyond the prescribed temperature as described above, whereby stress applied to the opening upper end can be relaxed. Thus, thermal oxidation in a high-temperature region can be performed while relaxing stress applied to the opening upper end, whereby reduction of the oxidizing velocity can be prevented. Consequently, the opening upper end of the element isolation trench can be sufficiently rounded.

In the method of fabricating a semiconductor device according to the aforementioned aspect, the step of suppressing formation of the first oxide film preferably includes a step of increasing the temperature of the semiconductor substrate to the prescribed temperature in a non-oxidizing atmosphere thereby suppressing formation of the first oxide film. Thus, the first oxide film can be readily inhibited from formation under a low temperature below the prescribed temperature.

In this case, the method of fabricating a semiconductor device preferably further comprises a step of forming a second oxide film having a smaller thickness than the first oxide film in advance of the step of suppressing formation of the first oxide film. Thus, it is possible to suppress thermal nitriding that may be caused when the temperature of the semiconductor substrate is increased to the prescribed temperature in the non-oxidizing atmosphere or etching with an extremely small amount of oxygen. When a nitrogen atmosphere is employed as the non-oxidizing atmosphere, the surface of the substrate is disadvantageously roughened due to nitriding (thermal nitriding). When the non-oxidizing atmosphere contains an extremely small amount of oxygen, the surface of the substrate is not oxidized but etched with the extremely small amount of oxygen. Thus, the surface of the substrate is roughened. According to the present invention, the aforementioned thermal nitriding or etching can be suppressed by previously forming the second oxide film having a small thickness on the surface of the substrate. The aforementioned etching with an extremely small amount of oxygen is disclosed in "Ultraclean, integrated processing of thermal oxide structure", Appl. Phys. Lett. 57, No. 12, Sep. 17, 1990, pp. 1254–1256 etc.

In this case, the step of forming the second oxide film preferably includes a step of forming the second oxide film in an atmosphere prepared by adding a small amount of oxygen to non-oxidizing gas consisting of at least either rare gas or nitrogen gas. Thus, the second oxide film having a small thickness can be readily formed. In this case, the concentration of the oxygen is preferably at least about 0.2% and not more than about 25%. Further, the second oxide film preferably has a thickness of at least about 2.0 nm and not more than about 6.0 nm.

In the method of fabricating a semiconductor device according to the aforementioned aspect, the aforementioned prescribed temperature is preferably a temperature reducing the coefficient of viscosity of the first oxide film formed by the thermal oxidation below a prescribed value. Thus, the formed first oxide film readily causes viscous flow, whereby the semiconductor substrate can be effectively prevented from application of stress in high-temperature oxidation. In this case, the prescribed temperature is preferably at least about 950° C. and not more than about 1150° C.

In the method of fabricating a semiconductor device according to the aforementioned aspect, the step of forming the first oxide film preferably includes a step of performing thermal oxidation in an oxygen atmosphere prepared by diluting oxygen with non-oxidizing gas consisting of at least either rare gas or nitrogen gas while increasing the temperature of the semiconductor substrate beyond a prescribed temperature thereby forming the first oxide film. Thus, the amount of formation of the first oxide film can be more correctly controlled. In this case, the concentration of the oxygen is preferably at least about 2.0% and not more than about 35%. Further, the first oxide film preferably has a thickness of at least about 10 nm and not more than about 50 nm.

In the method of fabricating a semiconductor device according to the aforementioned aspect, the step of forming the first oxide film preferably includes a step of performing thermal oxidation in an oxygen atmosphere containing halogen-based gas while increasing the temperature of the semiconductor substrate beyond a prescribed temperature thereby forming the first oxide film. When thermal oxidation is performed in the oxygen atmosphere containing halogen-based gas, the diffusion coefficient of an oxidant is so increased that rounding/oxidation of the opening upper end can be facilitated. Further, the temperature for properly rounding/oxidizing the opening upper end can be reduced due to such facilitation of oxidation.

In this case, the halogen-based gas may include Cl-based halogen gas, and the concentration of the Cl-based halogen gas with respect to an oxidant may be at least about 1.0% and not more than about 10%. Alternatively, the halogen-based gas may include F-based halogen gas, and the concentration of the F-based halogen gas with respect to an oxidant may be at least about 0.0005% and not more than about 0.1%.

The method of fabricating a semiconductor device according to the aforementioned aspect preferably further comprises a step of reducing the temperature in a non-oxidizing atmosphere after forming the first oxide film. Thus, formation of a thermal oxide film can be suppressed during temperature reduction. In this case, the step of reducing the temperature preferably includes a step of reducing the temperature to about 650° C. to about 800° C. in a non-oxidizing atmosphere.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

First, a process of forming a trench (element isolation trench) according to the embodiment of the present invention is described with reference to FIGS. 1 to 3.

Figure 1:
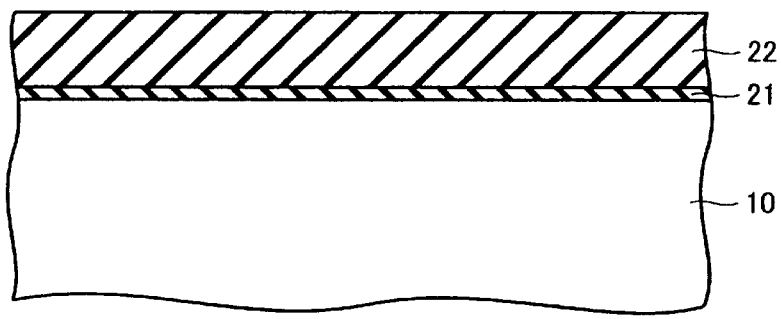
FIGS. 1 to 3 are sectional views for illustrating a process of forming a trench in a semiconductor device according to an embodiment of the present invention.

As shown in FIG. 1, a silicon oxide film 21 is formed on a semiconductor substrate 10 of silicon, and thereafter a silicon nitride film 22 is formed on the silicon oxide film 21. The silicon oxide film 21 is provided for preventing the silicon nitride film 22 from coming into direct contact with the semiconductor substrate 10 consisting of silicon. If the silicon nitride film 22 comes into direct contact with the semiconductor substrate 10 consisting of silicon, the semiconductor substrate 10 may cause a defect. Therefore, the silicon oxide film 21 is interposed between the silicon nitride film 22 and the semiconductor substrate 10 consisting of silicon. The thickness of the silicon oxide film 21, preferably about 5 nm to about 40 nm, is set to about 20 nm in this embodiment.

Figure 2:
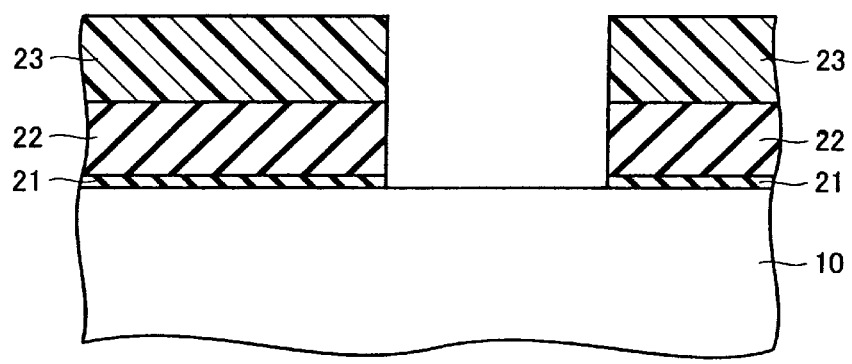

As shown in FIG. 2, a resist pattern 23 is formed on a prescribed region of the silicon nitride film 22, for etching the silicon nitride film 22 and the silicon oxide film 21 through the resist pattern 23 serving as a mask. Thus, the silicon nitride film 22 and the silicon oxide film 21 are patterned. Thereafter the resist pattern 23 is removed.

Figure 3:
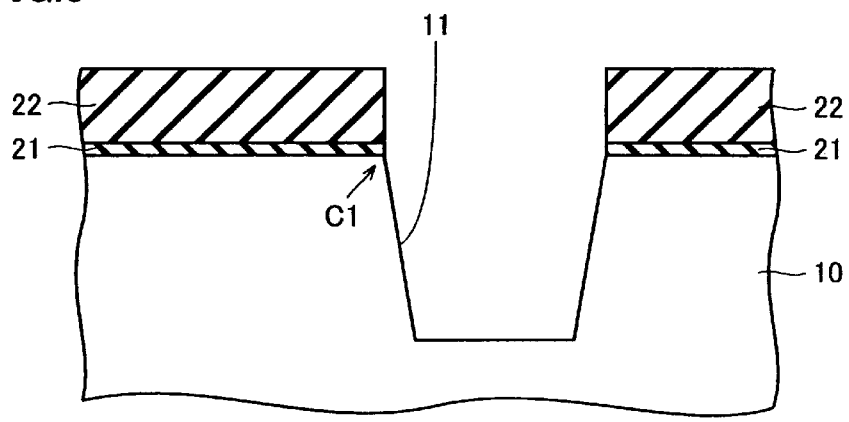

As shown in FIG. 3, the semiconductor substrate 10 is etched through the silicon nitride film 22 serving as a mask, thereby forming a trench (element isolation trench) 11.

In the state shown in FIG. 3, a corner potion is defined on an opening upper end C1 of the semiconductor substrate 10. According to this embodiment, thermal oxidation is performed on the trench 11 of the semiconductor substrate 10 for rounding the opening upper end C1 by removing the corner portion. The temperature for this thermal oxidation is preferably set to about 950° C. to about 1150° C., i.e., a temperature sufficiently reducing the coefficient of viscosity of a silicon oxide film formed by the thermal oxidation. Thus, the opening upper end C1 can be sufficiently rounded by performing thermal oxidation on the opening upper end C1 in the temperature region sufficiently reducing the coefficient of viscosity.

According to this embodiment, a thin silicon oxide film (second oxide film) is formed in a temperature region of about 650° C. to about 800° C. before performing the thermal oxidation for rounding the opening upper end C1 of the trench 11 after forming the trench 11 in the step shown in FIG. 3. Thereafter the temperature is increased to the temperature region (about 950° C. to about 1150° C.) suitable for rounding the opening upper end C1 in a non-oxidizing atmosphere.

When the thin silicon oxide film is previously formed, it is possible to suppress thermal nitriding that may be caused when the temperature is increased in the non-oxidizing atmosphere hardly oxidizing the semiconductor substrate 10 or etching with an extremely small amount of oxygen. When a nitrogen atmosphere is employed as the non-oxidizing atmosphere, the surface of the trench 11 is disadvantageously roughened due to nitriding (thermal nitriding). When the non-oxidizing atmosphere contains an extremely small amount of oxygen, the surface of the trench 11 is not oxidized but etched with the extremely small amount of oxygen. Thus, the surface of the trench 11 is roughened also in this case. According to this embodiment, such thermal nitriding or etching can be suppressed by previously forming the thin silicon oxide film on the surface of the trench 11.

The procedure of the thermal oxidation on the opening upper end C1 of the semiconductor substrate 10 according to this embodiment is now described in detail with reference to FIG. 4.

According to this embodiment, the silicon oxide film having a small thickness of about 2.0 nm to about 6.0 nm is formed on the surface of the trench 11 of the semiconductor substrate 10 after forming the trench 11 in the semiconductor substrate 10 in the step shown in FIG. 3. More specifically, the semiconductor substrate 10 is inserted into a heat treatment apparatus formed by a resistance-heating batch-processing electric furnace in a relatively low-temperature region of about 650° C. to about 800° C. after formation of the trench 11. At this time, the heat treatment apparatus is set under an atmosphere prepared by adding a small amount of oxygen ($O_2$) to rare gas such as Argon (Ar) or helium (He) or non-oxidizing gas such as nitrogen ($N_2$) incapable of oxidizing the semiconductor substrate 10. The oxygen concentration, preferably about 0.2% to about 25%, is set to about 10% in this embodiment. Thus, the thin silicon oxide film having a small thickness of about 2.0 nm to about 6.0 nm can be formed by inserting the semiconductor substrate 10 into the heat treatment apparatus in the atmosphere containing a small amount of component capable of oxidizing the semiconductor substrate 10.

After forming the aforementioned silicon oxide film (low-temperature oxide film) having a small thickness of about 2.0 nm to about 6.0 nm, the temperature in the aforementioned heat treatment apparatus is increased to a level of about 950° C. to about 1150° C. in a non-oxidizing atmosphere hardly oxidizing the semiconductor substrate 10. This non-oxidizing atmosphere is mainly composed of rare gas such as Argon (Ar) or helium (He) or non-oxidizing gas such as nitrogen ($N_2$) incapable of oxidizing the semiconductor substrate 10.

After increasing the temperature in the heat treatment apparatus to about 950° C. to about 1150° C., the atmosphere in the heat treatment apparatus is switched to an oxidizing atmosphere capable of oxidizing the semiconductor substrate 10, thereby performing thermal oxidation. Thus, a silicon oxide film (first oxide film) having a thickness of about 10 nm to about 50 nm is formed. The oxidizing atmosphere is preferably prepared by diluting oxygen with the aforementioned non-oxidizing gas. In this case, the oxygen concentration is preferably about 2.0% to about 35%. According to this embodiment, the oxygen concentration is set to about 10%.

Figure 4:
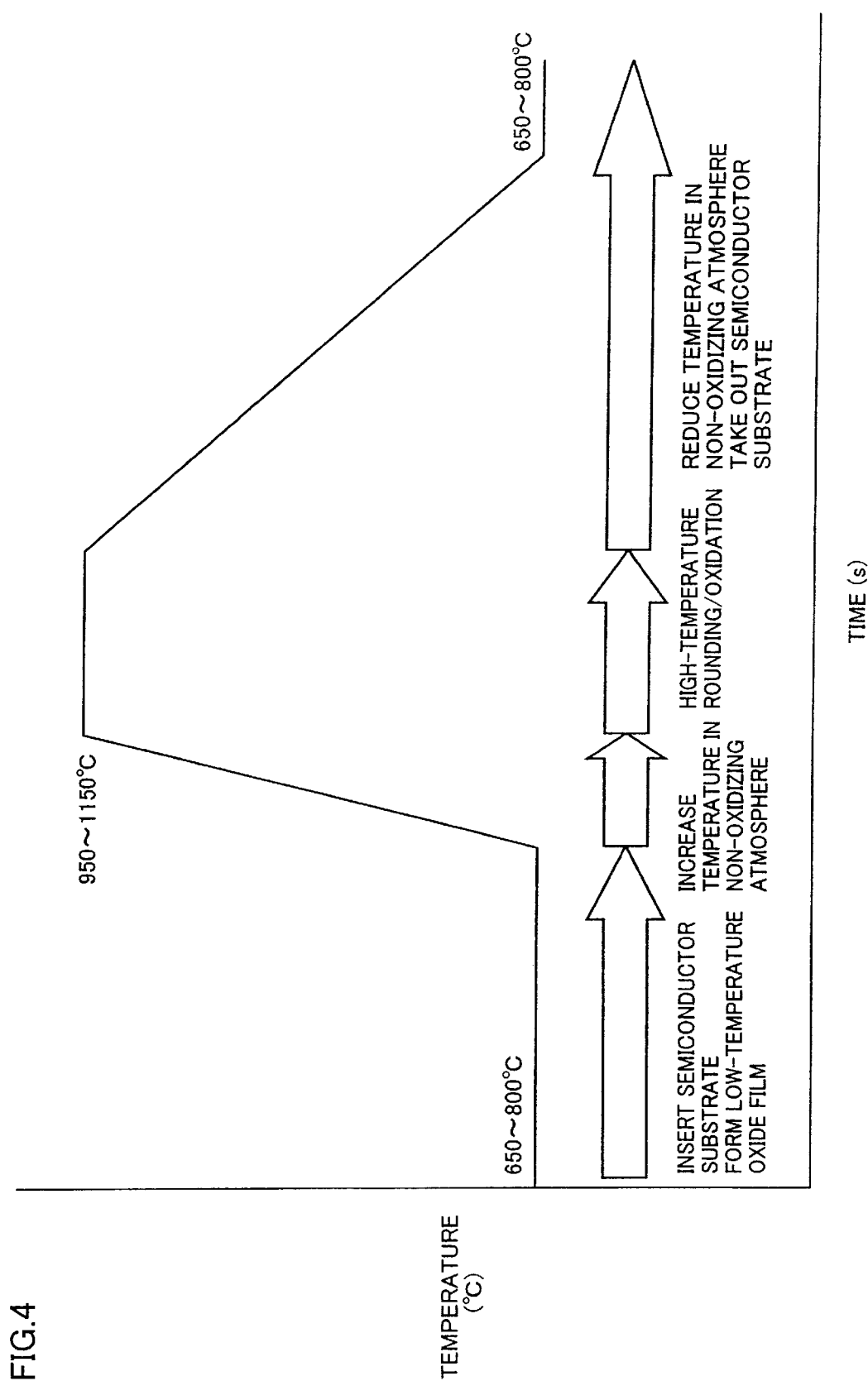
FIG. 4 is a timing chart for illustrating the procedure of thermal oxidation of the trench in the semiconductor device according to the embodiment of the present invention.

After forming the silicon oxide film (first oxide film) of about 10 nm to about 50 nm, the atmosphere in the heat treatment apparatus is switched to the aforementioned non-oxidizing atmosphere, as shown in FIG. 4. Then, the temperature is reduced to about 650° C. to about 800° C.

When rounding/oxidizing the opening upper end C1 in the high-temperature region while reducing the thickness of the silicon oxide film in the low-temperature region, the opening upper end C1 can be sufficiently rounded without much increasing the thickness of the silicon oxide film.

The difference between thermal oxidation according to this embodiment and thermal oxidation according to comparative example increasing the temperature under an oxidizing atmosphere is now described with reference to FIGS. 5 to 8.

Figure 5:
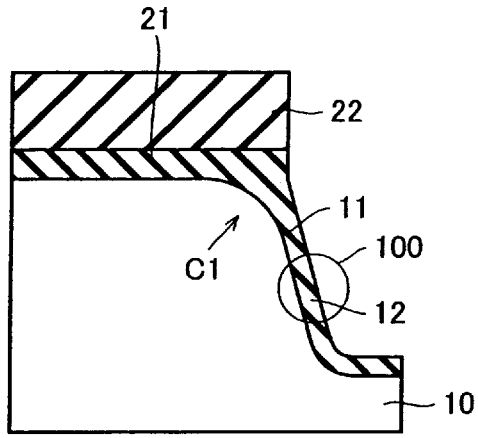
FIG. 5 is a sectional view showing a thermal oxide film formed by a method of fabricating a semiconductor device according to the embodiment of the present invention.
Figure 6:
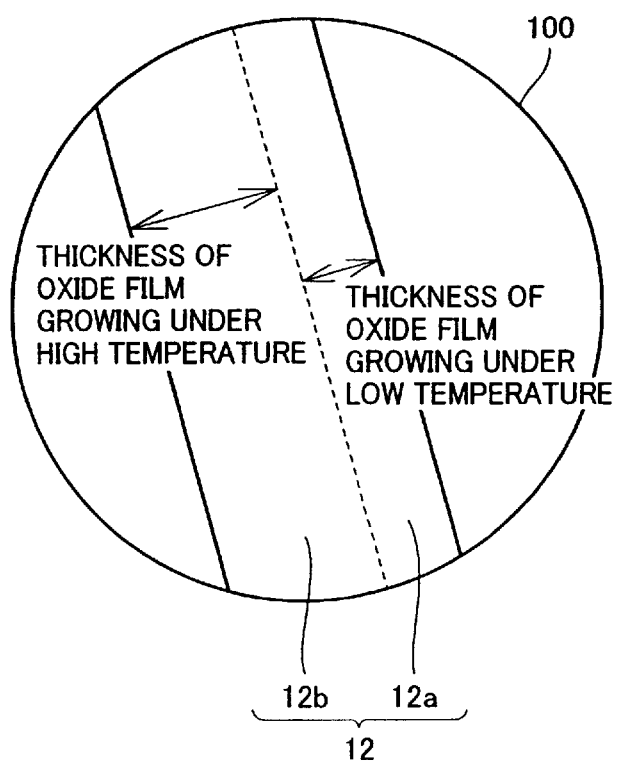
FIG. 6 is an enlarged view of a part 100 of the thermal oxide film shown in FIG. 5.

According to this embodiment, a silicon oxide film 12a having a small thickness is formed under a low temperature and thereafter a silicon oxide film 12b having a large thickness is formed under a high temperature, as shown in FIGS. 5 and 6. Thus, a thermal oxide film 12 consisting of the silicon oxide films 12a and 12b is formed on the surface of the trench 11. The thermal oxide film 12 mostly consists of the silicon oxide film 12b formed at the temperature of about 950° C. to about 1150° C. sufficiently reducing the coefficient of viscosity, whereby only small influence is exerted by stress resulting from the silicon oxide film 12a formed under a low temperature in high-temperature oxidation for forming the silicon oxide film 12b.

Thus, high-temperature oxidation for forming the silicon oxide film 12b can be performed while relaxing stress in this embodiment, whereby reduction of the oxidizing velocity for the silicon oxide film 12b can be prevented. Consequently, the opening upper end C1 can be sufficiently rounded as shown in FIG. 5.

Figure 7:
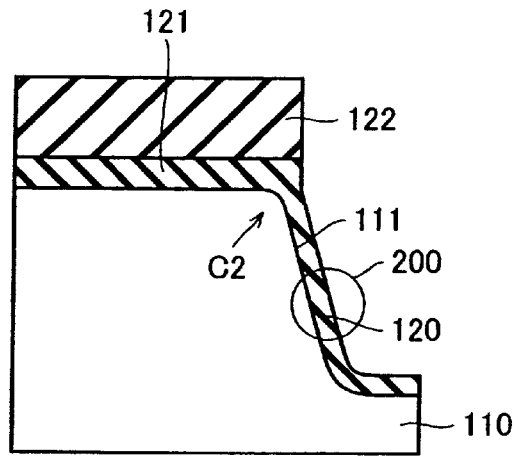
FIG. 7 is a sectional view for illustrating a thermal oxide film according to comparative example.
Figure 8:
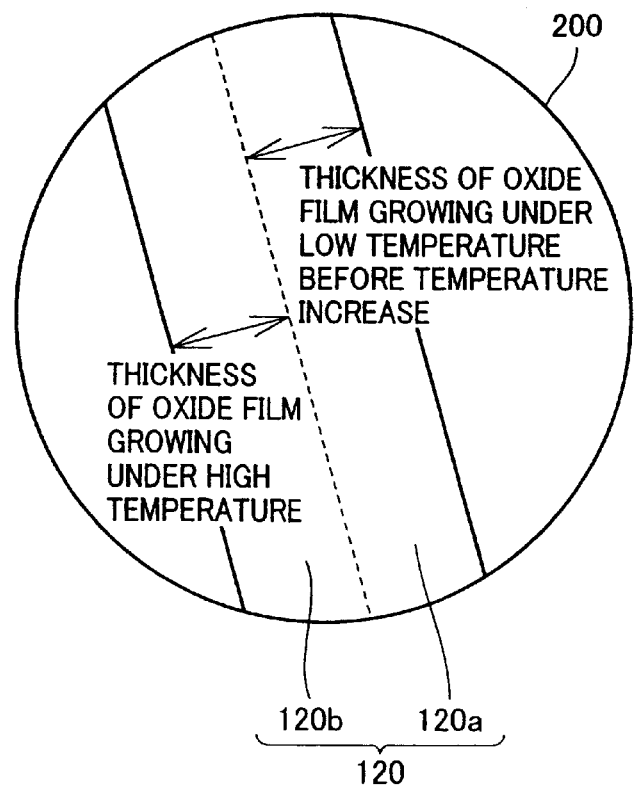
FIG. 8 is an enlarged view of a part 200 of the thermal oxide film according to comparative example shown in FIG. 7.

When oxidation is performed while forming a silicon nitride film 122 on a semiconductor substrate 110 through a silicon oxide film 121 by increasing the temperature in an oxidizing atmosphere as in comparative example, the thickness of a silicon oxide film 120a, defining a thermal oxide film 120 formed in a trench 111 of the semiconductor substrate 110, formed under low-temperature environment not yet sufficiently increased in temperature is increased. Therefore, the ratio of the silicon oxide film 120a formed under a low temperature to a silicon oxide film 120b formed under a high temperature is increased. Consequently, an overhanging point is formed on an opening upper end C2 of the trench 111 due to stress resulting from the silicon oxide film 120a, formed under a low temperature, having a high coefficient of viscosity. Even if oxidation is performed in a high-temperature region sufficient for stress relaxation, therefore, the opening upper end C2 cannot be sufficiently rounded. In comparative example, therefore, it is difficult to sufficiently round the opening upper end C2 of the trench 111, as shown in FIG. 7.

According to this embodiment, as hereinabove described, thermal oxidation is performed after increasing the temperature in a non-oxidizing atmosphere thereby suppressing formation of a silicon oxide film having a large thickness in a low-temperature region, whereby it is possible to suppress deterioration of the shape resulting from stress applied to the opening upper end C1. Thus, thermal oxidation can be performed in a larger quantity in a high-temperature region relaxing stress applied to the opening upper end C1, whereby the opening upper end C1 of the semiconductor substrate 10 can be sufficiently rounded.

Further, formation of a thermal oxide film can be suppressed in temperature reduction by reducing the temperature in a non-oxidizing atmosphere after rounding the opening upper end C1 by thermal oxidation following temperature increase.

Although the present invention has been described and illustrated in detail, it is clearly understood that the same is by way of illustration and example only and is not to be taken by way of limitation, the spirit and scope of the present invention being limited only by the terms of the appended claims.

While rare gas such as argon (Ar) or helium (He) or nitrogen ($N_2$) gas is employed as the non-oxidizing gas in the aforementioned embodiment, for example, the present invention is not restricted to this but another non-oxidizing gas may alternatively be employed. When only rare gas is employed as the non-oxidizing gas, occurrence of thermal nitriding can be prevented when increasing the temperature. Therefore, the thin silicon oxide film may not be formed before increasing the temperature for suppressing thermal nitriding.

While the thin silicon oxide film is formed before increasing the temperature in the aforementioned embodiment, the present invention is not restricted to this but the thin silicon oxide film may not be formed before increasing the temperature. When the semiconductor substrate 10 formed with the trench 11 contains no oxygen hence and influence by etching with an extremely small amount of oxygen is ignorable or thermal nitriding can be prevented as described above, no thin silicon oxide film may be formed before increasing the temperature.

While thermal oxidation is performed in the atmosphere prepared by diluting oxygen with the non-oxidizing gas after increasing the temperature in the aforementioned embodiment, the present invention is not restricted to this but oxygen may not be diluted if formation of an oxide film can be sufficiently controlled in an oxygen gas atmosphere and the oxidation time is sufficiently longer than the time necessary for stress relaxation.

In the aforementioned embodiment, a small amount of vapor ($H_2O$) may be added to the atmosphere prepared by diluting oxygen with the non-oxidizing gas in the thermal oxidation after increasing the temperature.

Further, halogen-based gas such as Cl-based halogen gas such as hydrogen chloride (HCl), chlorine ($Cl_2$), carbon tetrachloride ($CCl_4$) or methane dichloride ($CH_2Cl_2$) or F-based halogen gas such as nitrogen trifluoride ($NF_3$) may be added to the aforementioned atmosphere prepared by diluting oxygen with the non-oxidizing gas. When Cl-based halogen gas is added to the atmosphere prepared by diluting oxygen with the non-oxidizing gas, the diffusion coefficient of an oxidant is increased to facilitate oxidation of the opening upper end C1. The concentration of the Cl-based halogen gas with respect to the oxidant is preferably about 1.0% to about 10%. When F-based halogen gas is added to the atmosphere prepared by diluting oxygen with the non-oxidizing gas, stress resulting from oxidation can be relaxed. The concentration of the F-based halogen gas with respect to the oxidant is preferably about 0.0005% to about 0.1%. Rounding/oxidation of the opening upper end C1 can be facilitated by adding halogen-based gas, whereby the temperature for properly rounding/oxidizing the opening upper end C1 can be reduced.

While the resistance-heating batch-processing electric furnace is employed as the heat treatment apparatus in the aforementioned embodiment, the present invention is not restricted to this but a lamp-heating single wafer processing rapid thermal processor (RTP), for example, may alternatively be employed.

While the trench 11 is formed by patterning the silicon nitride film 22 and thereafter etching the semiconductor substrate 10 through the silicon nitride film 22 serving as a mask in the aforementioned embodiment, the present invention is not restricted to this but the trench 11 may alternatively be formed by another method.

While thermal oxidation is performed while locating the silicon nitride film 22 on the opening upper end C1 as shown in FIG. 3 in the aforementioned embodiment, the present invention is not restricted to this but thermal oxidation may alternatively be performed after removing the silicon nitride film 22 from a portion around the opening upper end C1 by etching. In this case, stress of the silicon nitride film 22 applied to the portion around the opening upper end C1 can be relaxed. Thus, the semiconductor substrate 10 is so readily volume-expanded that the portion around the opening upper end C1 is readily oxidized.

What is claimed is:

1. A method of fabricating a semiconductor device comprising steps of:

forming an element isolation trench on a semiconductor substrate;

performing thermal oxidation on at least an opening upper end of said element isolation trench after increasing the atmosphere temperature of said semiconductor substrate to a prescribed temperature thereby forming a first oxide film; and suppressing formation of said first oxide film on said opening upper end before said atmosphere temperature is increased to said prescribed temperature.

2. The method of fabricating a semiconductor device according to claim 1, wherein said step of suppressing formation of said first oxide film includes a step of increasing the temperature of said semiconductor substrate to said prescribed temperature in a non-oxidizing atmosphere thereby suppressing formation of said first oxide film.

3. The method of fabricating a semiconductor device according to claim 2, further comprising a step of forming a second oxide film having a smaller thickness than said first oxide film in advance of said step of suppressing formation of said first oxide film.

4. The method of fabricating a semiconductor device according to claim 3, wherein said step of forming said second oxide film includes a step of forming said second oxide film in an atmosphere prepared by adding a small amount of oxygen to non-oxidizing gas consisting of at least either rare gas or nitrogen gas.

5. The method of fabricating a semiconductor device according to claim 4, wherein the concentration of said oxygen is at least about 0.2% and not more than about 25%.

6. The method of fabricating a semiconductor device according to claim 3, wherein said second oxide film has a thickness of at least about 2.0 nm and not more than about 6.0 nm.

7. The method of fabricating a semiconductor device according to claim 1, wherein said prescribed temperature is a temperature reducing the coefficient of viscosity of said first oxide film formed by said thermal oxidation below a prescribed value.

8. The method of fabricating a semiconductor device according to claim 7, wherein said prescribed temperature is at least about 950° C. and not more than about 1150° C.

9. The method of fabricating a semiconductor device according to claim 1, wherein said step of forming said first oxide film includes a step of performing thermal oxidation in an oxygen atmosphere prepared by diluting oxygen with non-oxidizing gas consisting of at least either rare gas or nitrogen gas after increasing the temperature of said semiconductor substrate to a prescribed temperature thereby forming said first oxide film.

10. The method of fabricating a semiconductor device according to claim 9, wherein the concentration of said oxygen is at least about 2.0% and not more than about 35%.

11. The method of fabricating a semiconductor device according to claim 9, wherein said first oxide film has a thickness of at least about 10 nm and not more than about 50 nm.

12. The method of fabricating a semiconductor device according to claim 1, wherein said step of forming said first oxide film includes a step of performing thermal oxidation in an oxygen atmosphere containing halogen-based gas after increasing the temperature of said semiconductor substrate to a prescribed temperature thereby forming said first oxide film.

13. The method of fabricating a semiconductor device according to claim 12, wherein said halogen-based gas includes Cl-based halogen gas, and the concentration of said Cl-based halogen gas with respect to an oxidant is at least about 1.0% and not more than about 10%.

14. The method of fabricating a semiconductor device according to claim 12, wherein said halogen-based gas includes F-based halogen gas, and the concentration of said F-based halogen gas with respect to an oxidant is at least about 0.0005% and not more than about 0.1%.

15. The method of fabricating a semiconductor device according to claim 1, further comprising a step of reducing the temperature in a non-oxidizing atmosphere after forming said first oxide film.

16. The method of fabricating a semiconductor device according to claim 15, wherein said step of reducing the temperature includes a step of reducing the temperature to about 650° C. to about 800° C. in a non-oxidizing atmosphere.

* * * * *